United States Patent
Grassmann

(10) Patent No.: US 12,261,063 B2
(45) Date of Patent: Mar. 25, 2025

(54) METHOD AND DEVICE FOR PRODUCING A HOUSING

(71) Applicant: Infineon Technologies AG, Neubiberg (DE)

(72) Inventor: Andreas Grassmann, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 394 days.

(21) Appl. No.: 17/685,870

(22) Filed: Mar. 3, 2022

(65) Prior Publication Data

US 2022/0285178 A1 Sep. 8, 2022

(30) Foreign Application Priority Data

Mar. 5, 2021 (EP) .................................... 21160985

(51) Int. Cl.
*H01L 21/56* (2006.01)
*H01L 21/67* (2006.01)
*H01L 23/00* (2006.01)

(52) U.S. Cl.
CPC ...... *H01L 21/67126* (2013.01); *H01L 21/565* (2013.01); *H01L 24/32* (2013.01);
(Continued)

(58) Field of Classification Search
CPC . H01L 21/67126; H01L 21/565; H01L 24/32; H01L 24/48; H01L 24/73; H01L 2224/32225; H01L 2224/48225; H01L 2224/73265; H01L 2924/15322; H01L 2924/1616; H01L 2924/16251; H01L 2924/182; H01L 23/3121; H01L 23/3735; H01L 25/072; H01L 2224/291; H01L 2224/2929; H01L 2224/29339;
(Continued)

(56) References Cited

U.S. PATENT DOCUMENTS

2013/0015567 A1* 1/2013 Minamio ............ H01L 23/3107
257/676
2015/0145123 A1 5/2015 Ha
(Continued)

FOREIGN PATENT DOCUMENTS

CN 101740527 A 6/2010
JP 2009059812 A 3/2009
(Continued)

*Primary Examiner* — Elias Ullah
(74) *Attorney, Agent, or Firm* — Murphy, Bilak & Homiller, PLLC

(57) ABSTRACT

A device for forming a housing for a power semiconductor module arrangement includes a mold. The mold includes a first cavity including a plurality of first openings and a second opening, the second opening being coupled to a runner system, wherein the runner system is configured to inject a mold material into the first cavity through the second opening. The device further includes a plurality of sleeves or hollow bushings, wherein a first end of each of the plurality of sleeves or hollow bushings is arranged in one of the first openings, and wherein a second end of each of the plurality of sleeves or hollow bushings extends to the outside of the mold, a heating element configured to heat the mold, and a cooling element configured to cool the plurality of sleeves or hollow bushings.

15 Claims, 5 Drawing Sheets

(52) U.S. Cl.
CPC .............. *H01L 24/48* (2013.01); *H01L 24/73* (2013.01); *H01L 2224/32225* (2013.01); *H01L 2224/48225* (2013.01); *H01L 2224/73265* (2013.01); *H01L 2924/15322* (2013.01); *H01L 2924/1616* (2013.01); *H01L 2924/16251* (2013.01); *H01L 2924/182* (2013.01)

(58) Field of Classification Search
CPC . H01L 2224/32238; H01L 2224/45099; H01L 2224/48227; H01L 2224/48229; H01L 2224/83424; H01L 2224/83447; H01L 2224/85424; H01L 2224/85447; H01L 2924/1815; H01L 23/04; B29C 65/44; B29C 33/00; B29C 35/16; B29D 99/006
See application file for complete search history.

(56) References Cited

U.S. PATENT DOCUMENTS

| | | |
|---|---|---|
| 2017/0236782 A1 | 8/2017 | Nonaka |
| 2020/0350236 A1 | 11/2020 | Umeda et al. |

FOREIGN PATENT DOCUMENTS

| | | |
|---|---|---|
| JP | 2011077280 A | 4/2011 |
| JP | 2011165836 A | 8/2011 |
| JP | 5082687 B2 | 9/2012 |
| JP | 6738968 B1 | 7/2020 |

\* cited by examiner

METHOD AND DEVICE FOR PRODUCING A HOUSING

TECHNICAL FIELD

The instant disclosure relates to a method and a device for producing a housing, in particular a housing for a power semiconductor module arrangement.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate. The controllable semiconductor devices are usually mounted to the semiconductor substrate by soldering or sintering techniques.

There is a need for a method and a device that allow to easily and cost-effectively produce a housing for a power semiconductor module arrangement.

SUMMARY

A device for forming a housing for a power semiconductor module arrangement includes a mold. The mold includes a first cavity including a plurality of first openings and a second opening, the second opening being coupled to a runner system, wherein the runner system is configured to inject a mold material into the first cavity through the second opening. The device further includes a plurality of sleeves or hollow bushings, wherein a first end of each of the plurality of sleeves or hollow bushings is arranged in one of the first openings, and wherein a second end of each of the plurality of sleeves or hollow bushings extends to the outside of the mold, a heating element configured to heat the mold, and a cooling element configured to cool the plurality of sleeves or hollow bushings.

A method includes arranging a power semiconductor module arrangement in the first cavity of a device for forming a housing for a power semiconductor module arrangement, arranging one of a plurality of terminal elements in each of the plurality of sleeves or hollow bushings such that a first end of each of the terminal elements contacts the power semiconductor module arrangement, and a second end of each of the terminal elements protrudes through the respective sleeve or hollow bushing and out of the mold, heating a mold material and pressing the mold material into the first cavity, and cooling the plurality of sleeves or hollow bushings by means of the cooling element, wherein the mold material hardens in the vicinity of the first ends of the plurality of sleeves or hollow bushings when it comes into contact with the respective first end, thereby sealing the second openings of the first cavity.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
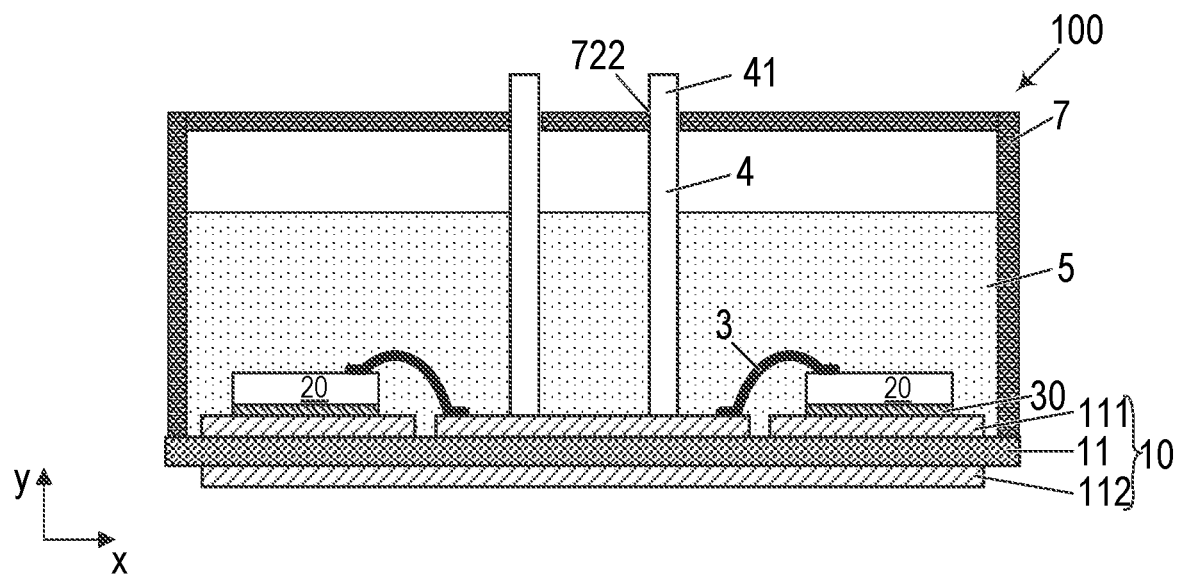
FIG. 1 is a cross-sectional view of a power semiconductor module arrangement.

Referring to FIG. 1, a cross-sectional view of a power semiconductor module arrangement 100 is illustrated. The power semiconductor module arrangement 100 includes a housing 7 and a semiconductor substrate 10. The semiconductor substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112. According to another example, the second metallization layer 112 can also be omitted.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 7. In the example illustrated in FIG. 1, the semiconductor substrate 10 forms a ground surface of the housing 7, while the housing 7 itself solely comprises sidewalls and a cover. This is, however, only an example. It is also possible that the housing 7 further comprises a ground surface and the semiconductor substrate 10 be arranged inside the housing 7. According to another example, the semiconductor substrate 10 may be mounted on a base plate (not illustrated). In some power semiconductor module arrangements 100, more than one semiconductor substrate 10 is arranged on a single base plate. The base plate may form a ground surface of the housing 7, for example.

One or more semiconductor bodies 20 may be arranged on the semiconductor substrate 10. Each of the semiconductor bodies 20 arranged on the semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the semiconductor substrate 10. In FIG. 1, only two semiconductor bodies 20 are exemplarily illustrated. The second metallization layer 112 of the semiconductor substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first metallization layer may have no electrical connection or may be electrically connected to one or more other sections using, e.g., bonding wires 3. Electrical connections 3 may also include connection plates or conductor rails, for example, to name just a few examples. The one or more semiconductor bodies 20 may be electrically and mechanically connected to the semiconductor substrate 10 by an electrically conductive connection layer 30. Such an electrically conductive connection layer may be a solder layer, a layer of an electrically conductive adhesive, or a layer of a sintered metal powder, e.g., a sintered silver powder, for example.

The power semiconductor module arrangement 100 illustrated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end, while a second end 41 of the terminal elements 4 protrudes through an opening 722 and out of the housing 7. The terminal elements 4 may be electrically contacted from the outside at their second end 41. The terminal elements 4 illustrated in FIG. 1, however, are only examples. Terminal elements 4 may be implemented in any other way and may be arranged anywhere within the housing 7. For example, one or more terminal elements 4 may be arranged close to or adjacent to the sidewalls of the housing 7. Terminal elements 4 can also extend vertically or horizontally through the sidewalls of the housing 7, for example. Any other suitable implementation is possible.

Conventional power semiconductor module arrangements 100 generally further include a casting compound 5. The casting compound 5 may consist of or include a silicone gel or may be a rigid molding compound, for example. The casting compound 5 may at least partly fill the interior of the housing 7, thereby covering the components and electrical connections that are arranged on the semiconductor substrate 10. The terminal elements 4 may be partly embedded in the casting compound 5. At least their second ends 41, however, are not covered by the casting compound 5 and protrude from the casting compound 5 through the housing 7 to the outside of the housing 7. The casting compound 5 is configured to protect the components and electrical connections inside the power semiconductor module 100, in particular inside the housing 7, from certain environmental conditions and mechanical damage. The casting compound 5 further provides for an electrical isolation of the components inside the housing 7.

Figure 2:
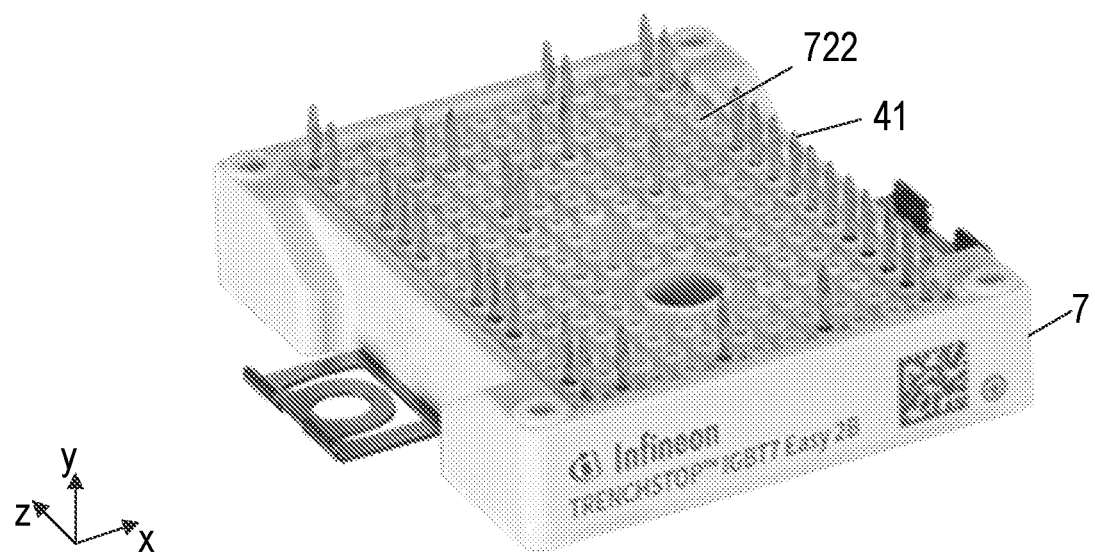
FIG. 2 is a diagonal view of a power semiconductor module arrangement.

Now referring to FIG. 2, a diagonal view of a power semiconductor module arrangement is schematically illustrated. In this diagonal view the substrate 10 inside the housing 7 with the semiconductor bodies 20 mounted thereon is not visible. Visible are only the openings 722 in the housing 7 and the second ends 41 of the terminal elements 4 protruding out of the housing 7.

Figure 3:
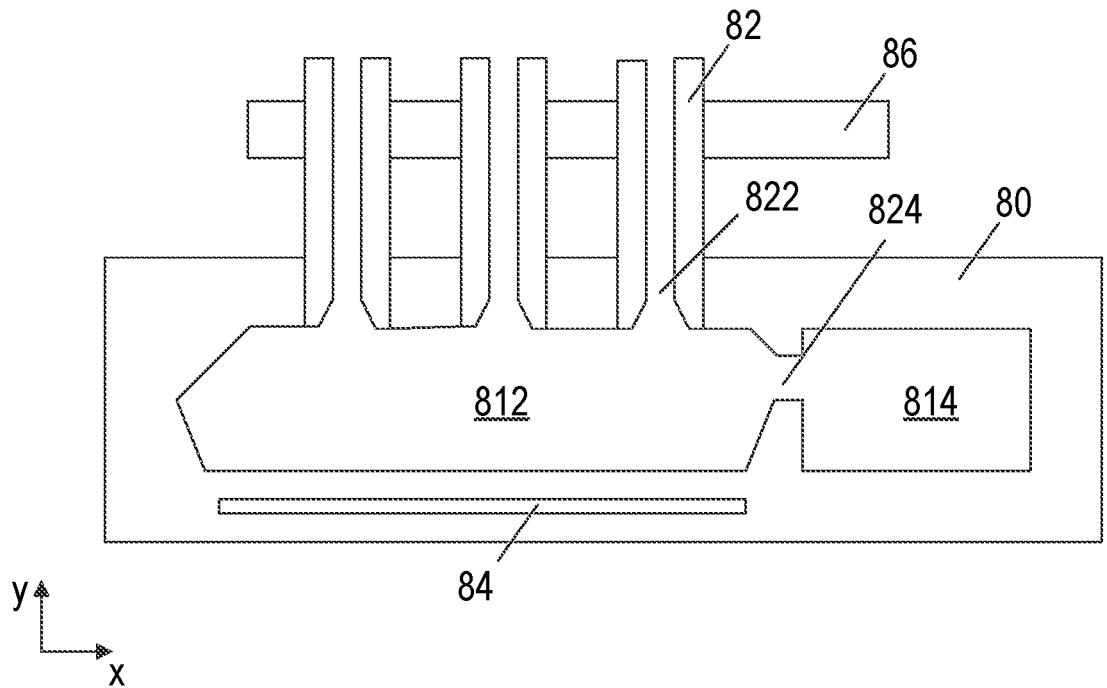
FIG. 3 is a cross-sectional view of a device for producing a housing for a power semiconductor module arrangement according to one example.

Producing the power semiconductor module arrangement 100 that has been explained with respect to FIGS. 1 and 2 above can be elaborate and costly. Now referring to FIG. 3, a device for forming a housing for a power semiconductor module arrangement according to one example is schematically illustrated. The device comprises a mold 80. A first cavity 812 is formed in the mold 80. The first cavity 812 comprises a plurality of first openings 822 and a second opening 824. The second opening 824 is coupled to a runner system 814 that is configured to inject a mold material 90 into the first cavity 812. This, however, is only an example. Mold material 90 can be inserted into the first cavity 812 through more than one second opening 824 coupled to the runner system 814, for example. Each of the first openings 822 forms a connection from the first cavity 812 to the outside of the mold.

A sleeve or hollow bushing 82 is inserted into each of the first openings 822. The device further comprises a cooling device 86 that is configured to cool the sleeves or hollow bushings 82, and a heating device 84 that is configured to heat the mold 80. A molded housing can be produced by means of the device illustrated in FIG. 3. That is, in contrast to the housing 7 that has been explained with respect to FIG. 1 above, the housing produced with the device of FIG. 3 does not comprise sidewalls and a cover, and a casting compound arranged inside the cavity formed by the sidewalls and the cover. The housing that can be formed with the device of FIG. 3 instead is a compact housing, and a semiconductor module arrangement is molded directly into the housing. This will be explained in further detail below.

Figure 4:
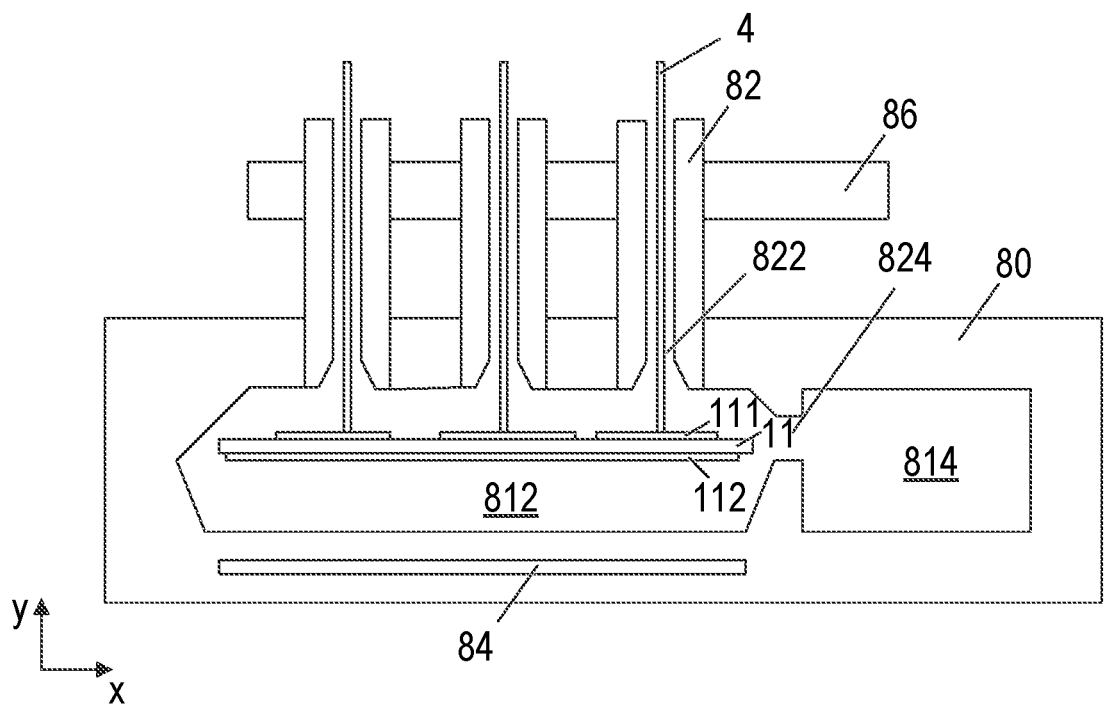
FIG. 4 is a cross-sectional view of the device for producing a housing for a power semiconductor module arrangement of FIG. 3 after the insertion of terminal elements.

Now referring to FIG. 4, a substrate 10 can be arranged inside the first cavity 812 of the mold 80. The substrate 10 can be similar to the substrate 10 that has been described with respect to FIG. 1 above. Semiconductor bodies 20, connection layers 30 or electrical connections 3, however, are not specifically illustrated in FIG. 4. A plurality of terminal elements 4 is arranged on the substrate 10. Each of the terminal elements 4 protrudes through one of the plurality of sleeves or hollow bushings 82 to the outside of the first cavity 812 and the outside of the mold 80.

Figure 5:
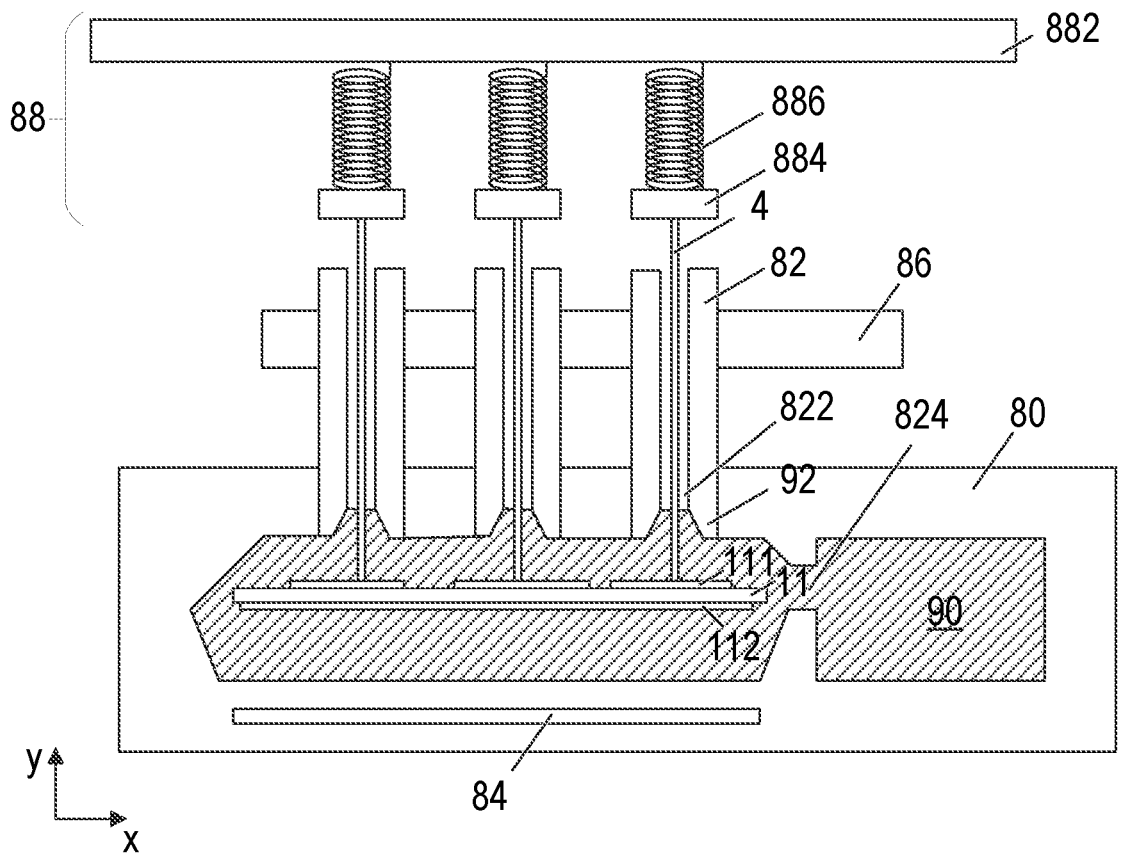
FIG. 5 is a cross-sectional view of the device for producing a housing for a power semiconductor module arrangement of FIG. 4 after the insertion of a mold material.

Now referring to FIG. 5, it is optionally possible to press the terminal elements 4 towards the substrate 10 by means of a downholder 88. In the example illustrated in FIG. 5, the downholder 88 comprises a plurality of springs 886 arranged between a first plate 882 and one of a plurality of second plates 884. Each of the plurality of second plates 884 is configured to contact one of the plurality of terminal elements 4. That is, the first plate 882 exerts a pressure on the plurality of springs 886 and each of the plurality of springs 886 exerts a pressure on one of the plurality of second plates 884 which is transferred to the terminal elements 4. In this way, a certain pressure can be exerted on the terminal elements 4 in order to press them on the substrate 10. The pressure, however, can be limited to a maximum value due to the flexibility of the springs 886. In this way damages to the terminal elements 4 and the substrate 10 when pressing the terminal elements 4 on the substrate 10 can be prevented. This, however, is only one example. A downholder 88 can be implemented in any other suitable way. In the example illustrated in FIG. 5, the first cavity 812 and the second cavity 814 are filled with a mold material 90. The mold material 90 inside the first cavity 812 forms the housing of the power semiconductor module arrangement. The first cavity 812, therefore, can have the desired form of the housing that is to be produced.

As will be further described with respect to FIG. 6 below, the housing can be easily formed by pressing the mold material 90 into the first cavity 812 and subsequently hardening the mold material 90. When filling the mold material 90 into the first cavity 812, the mold material is liquid or viscous. The sleeves or hollow bushings 82, however, form openings of the first cavity 812 through which mold material 90 can leak out of the first cavity 812. Leakage of the mold material 90 through the sleeves or hollow bushings 82, however, is prevented by means of the cooling device 86. The cooling device 86 is configured to cool the sleeves or hollow bushings 82. The mold material 90 is usually heated to a certain degree when pressing it into the first cavity 812 in order to keep it liquid or viscous. In order to be able to completely fill the first cavity 812 with the mold material 90, the mold 80 is heated by means of the heating device 84. This prevents the mold material 90 from hardening too early in order to be able to completely fill the first cavity 812 without the formation of any unwanted voids. However, when the mold material 90 comes into contact with the cooled sleeves or hollow bushings 82, it will cool down and seal the openings 822, thereby preventing the mold material 90 from leaking out of the first cavity 812.

Figures 6A, 6B:
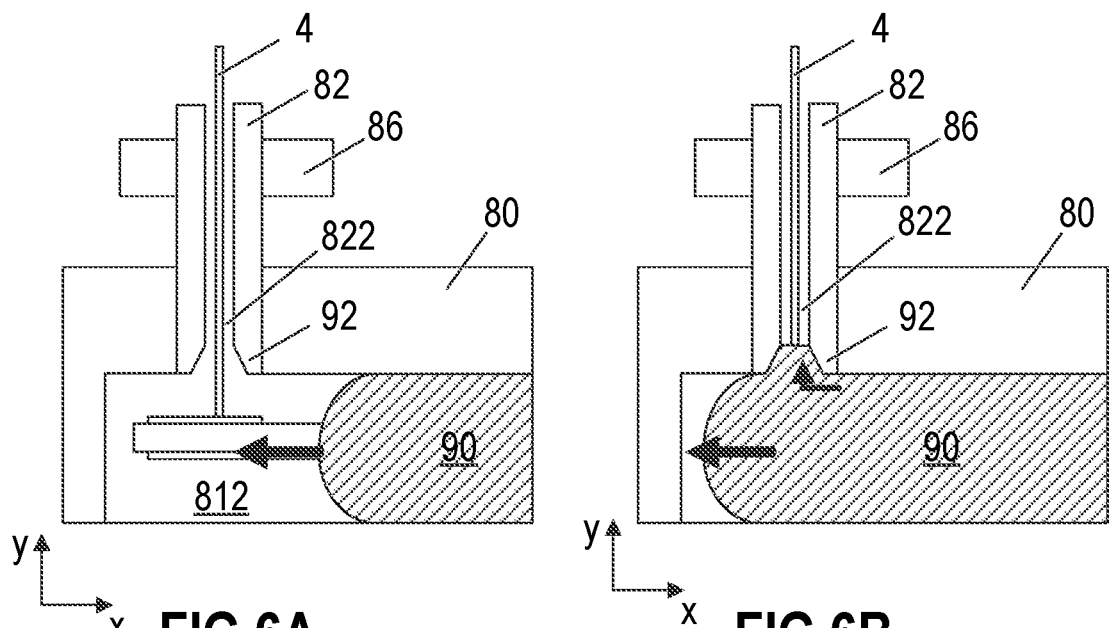
FIG. 6, comprising FIGS. 6A-6C schematically illustrates a method for forming a housing for a power semiconductor module arrangement.
Figure 6C:
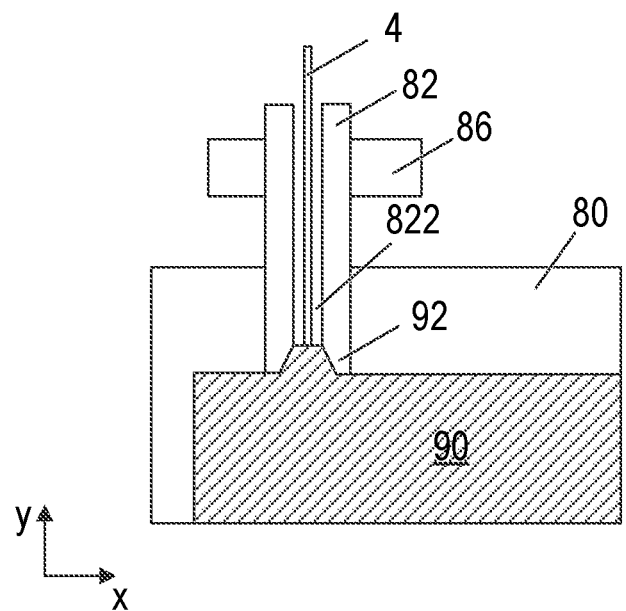

This will be explained in further detail with respect to FIG. 6. FIG. 6A schematically illustrates a cross-sectional view of a section of the mold 80. In FIG. 6A only one of the openings 822 is illustrated. The substrate 10 is partly visible in FIG. 6A. The mold material 90 is pressed into the first cavity 812. The bold arrow indicates the direction of movement of the mold material 90. Now referring to FIG. 6B, the mold material 90 is pressed further into the first cavity 812. When it comes into contact with the cooled sleeve or hollow bushing, it hardens and seals the opening 822. However, as the mold 80 is heated by means of the heating device 84 (not visible in FIG. 6), it only hardens in direct vicinity of the sleeve or hollow bushing 82 and remains liquid or viscous in all other parts. In this way, the mold material 90 can be pressed even further into the first cavity, as indicated by the bold arrow in FIG. 6B. FIG. 6C schematically illustrates a section of the mold 80 when the mold 80 is completely filled with the mold material 90. The semiconductor substrate arrangement is then molded into the mold material 90 and the mold material can be hardened. After hardening the mold material 90, the mold 80 can be removed.

Still referring to FIG. 6, each of the plurality of sleeves or hollow bushings 82 can comprise a funnel-shaped end 92 directed towards the first cavity 812. In this way, the surface of the sleeve or hollow bushings 82 can be increased in that area where the mold material 90 comes into contact with the sleeve or hollow bushing 82. This allows to more rapidly cool down the mold material in the vicinity of the sleeve or hollow bushing, thereby effectively sealing the opening 822 and preventing the mold material 90 from leaking out of the first cavity 812. According to one example, the mold material 90 only hardens in those sections arranged inside the funnel-shaped ends 92.

Figure 7:
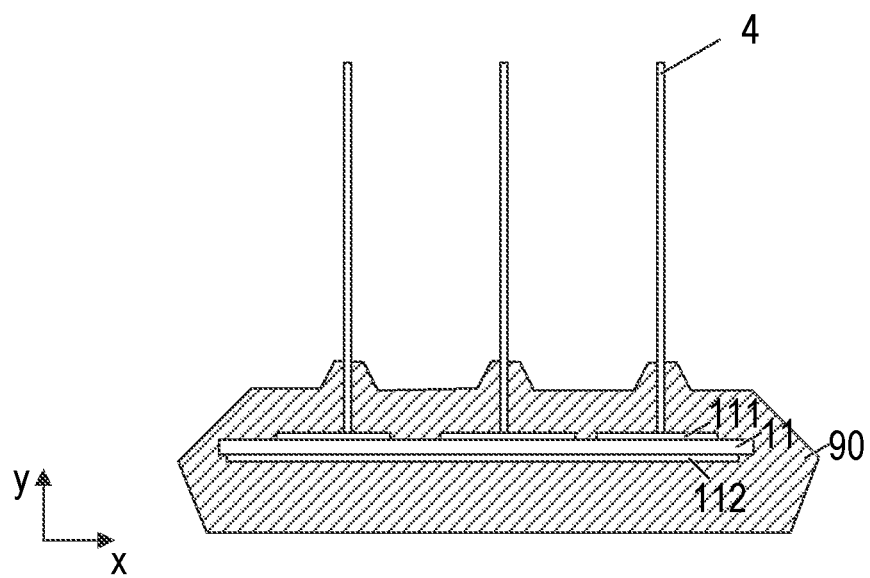
FIG. 7 is a cross-sectional view of a power semiconductor module arrangement molded into a housing.

FIG. 7 schematically illustrates a cross-sectional view of a semiconductor substrate 10 molded into a housing that has been produced by means of the device explained with respect to FIGS. 3 to 6 above. The housing has the form of the first cavity 812. On a top surface of the housing, a plurality of projections is visible. These projections result from the mold material 90 hardening in the range of the funnel-shaped ends 92 of the sleeves or hollow bushings 82.

According to one example, the sleeves or hollow bushings 82 can comprise a thermally conductive material such as, e.g., metal. According to one example, the sleeves or hollow bushings 82 comprise copper. This allows to arrange the cooling device such that it contacts an end of the sleeves or hollow bushings 82 which is arranged outside the first cavity 812 and to still cool down the other end of the sleeves or hollow bushings 82 that is arranged adjacent to the first cavity 812. The mold 80 can be heated up to a temperature of between 150° C. and 200° C., e.g., 180° C. The sleeves or hollow bushings 82 can be cooled down to a temperature of between 0° C. and 50° C., e.g., to room temperature. The mold material 90 can be liquefied at temperatures of between 150° C. and 200° C. and can be hardened at temperatures between 0° C. and 50° C. The temperatures generally depend on the kind of mold material 90 that is used to form the housing. The mold material 90 can comprise a thermoset or elastomer, for example. The cooling element 86 can be a water cooled cooling element, for example.

Figure 8:
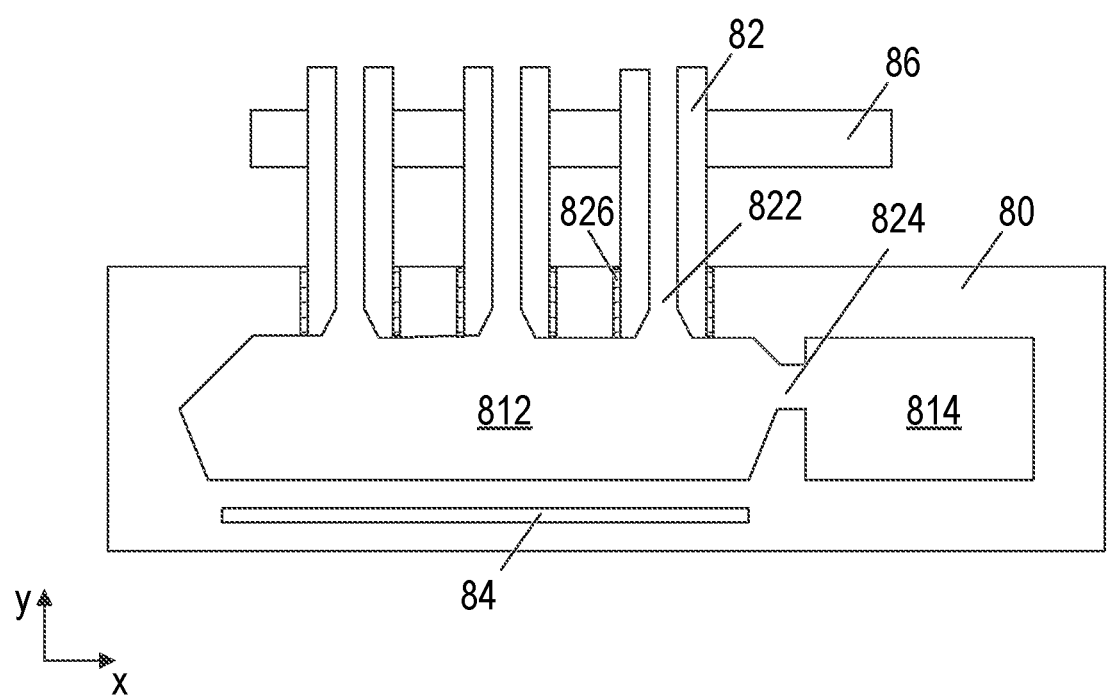
FIG. 8 is a cross-sectional view of a device for producing a housing for a power semiconductor module arrangement according to another example.

Now referring to FIG. 8, a cross-sectional view of a device for producing a housing for a power semiconductor module arrangement according to another example is schematically illustrated. The device generally corresponds to the device that has been described with respect to FIG. 3 above. In the example illustrated in FIG. 8, however, each of the sleeves or hollow bushings 82 is thermally isolated from the mold 80. As has been described above, the sleeves or hollow bushings 82 are cooled down, while the mold 80 is heated, when the mold material 90 is pressed into the first cavity 812. In order to keep both the sleeves or hollow bushings 82 and the mold 80 at the desired temperature, a thermal isolation 826 may be inserted between each of the sleeves or hollow bushings 82 and the mold 80. The thermal isolation 826 can comprise a layer of a thermally isolating material such as, e.g., Teflon. This, however, is only an example. Any other thermally isolating materials can be used instead. Instead of a layer of a thermally isolating material, the thermal isolation 826 can also comprise an air filled chamber. The air inside the chamber also has a thermally isolating effect. When arranging the thermal isolation 826 between the sleeves or hollow bushings 82 and the mold, a direct contact between the sleeves or hollow bushings 82 and the mold is avoided or at least reduced.

The invention claimed is:

1. A device for forming a housing for a power semiconductor module arrangement comprises a mold, wherein the mold comprises:
   a first cavity comprising a plurality of first openings and a second opening, the second opening being coupled to a runner system, wherein the runner system is configured to inject a mold material into the first cavity through the second opening;
   a plurality of sleeves or hollow bushings, wherein a first end of each of the plurality of sleeves or hollow bushings is arranged in one of the first openings, and wherein a second end of each of the plurality of sleeves or hollow bushings extends to the outside of the mold;
   a heating element configured to heat the mold; and
   a cooling element configured to cool the plurality of sleeves or hollow bushings.

2. The device of claim 1, wherein the cooling element is coupled to the second end of each of the plurality of sleeves or hollow bushings.

3. The device of claim 1, wherein each of the plurality of sleeves or hollow bushings comprises a heat conducting material.

4. The device of claim 3, wherein each of the plurality of sleeves or hollow bushings comprises a metal.

5. The device of claim 1, wherein the first cavity comprises the form of the housing that is to be formed.

6. The device of claim 1, further comprising a downholder, wherein the downholder is configured to, when a semiconductor module arrangement is arranged in the first cavity and one of a plurality of terminal elements is arranged in a different one of the plurality of sleeves or hollow bushings, press the plurality of terminal elements on the power semiconductor module arrangement.

7. The device of claim 6, wherein the downholder comprises a plurality of springs arranged between a first plate and one of a plurality of second plates, wherein each of the plurality of second plates is configured to contact one of the plurality of terminal elements.

8. The device of claim 1, wherein the heating element is configured to heat the mold to a temperature of between 150° C. and 200° C., and wherein the cooling element is configured to cool the plurality of sleeves or hollow bushings to a temperature of between 0° C. and 50° C.

9. The device of claim 1, wherein the cooling element is a water cooled cooling element.

10. The device of claim 1, wherein the first ends of the plurality of sleeves or hollow bushings are funnel-shaped.

11. The device of claim 1, further comprising a plurality of thermal isolations, wherein each thermal isolation is arranged between a different one of the plurality of sleeves or hollow bushings and the mold and is configured to thermally isolate the respective sleeve or hollow bushing from the mold.

12. The device of claim 11, wherein each of the plurality of thermal isolations comprises a layer of a thermally isolating material or an air filled chamber.

13. A method comprising:
   arranging a power semiconductor module arrangement in the first cavity of the device according to claim 1;
   arranging one of a plurality of terminal elements in each of the plurality of sleeves or hollow bushings such that a first end of each of the terminal elements contacts the power semiconductor module arrangement, and a second end of each of the terminal elements protrudes through the respective sleeve or hollow bushing and out of the mold;
   heating a mold material and pressing the mold material into the first cavity; and
   cooling the plurality of sleeves or hollow bushings by means of the cooling element, wherein
   the mold material hardens in the vicinity of the first ends of the plurality of sleeves or hollow bushings when it comes into contact with the respective first end, thereby sealing the second openings of the first cavity.

14. The method of claim 13, further comprising, after completely filling the first cavity with the mold material, hardening the mold material.

15. The method of claim 13, further comprising, while pressing the mold material into the first cavity, pressing the plurality of terminal elements on the power semiconductor module arrangement.

* * * * *